US006697037B1

(12) United States Patent
Alt et al.

(10) Patent No.: US 6,697,037 B1
(45) Date of Patent: Feb. 24, 2004

(54) TFT LCD ACTIVE DATA LINE REPAIR

(75) Inventors: Paul Matthew Alt; Pedro A. Chalco, both of Yorktown Heights; Bruce Kenneth Furman, Beacon; Raymond Robert Horton, Dover Plains; Chandrasekhar Narayan, Hopewell Junction, all of NY (US); Benal Lee Owens, Jr., Apex, NC (US); Kevin Wilson Warren, Fishkill; Steven Lorenz Wright, Cortlandt Manor, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/639,583

(22) Filed: Apr. 29, 1996

(51) Int. Cl.[7] .................................................. G09G 3/36
(52) U.S. Cl. ......................... 345/93; 345/206; 345/904
(58) Field of Search ............................ 345/93, 904, 87, 345/92, 55, 206; 324/158, 501; 349/54, 55, 192

(56) References Cited

U.S. PATENT DOCUMENTS

| 4,688,896 | A | 8/1987 | Castleberry | |
|---|---|---|---|---|
| 4,807,973 | A | 2/1989 | Kawasaki | |
| 4,819,038 | A | 4/1989 | Alt | |
| 4,840,459 | A | 6/1989 | Strong | |
| 5,045,753 | A | 9/1991 | Katayama et al. | |
| 5,063,378 | A | 11/1991 | Roach | |
| 5,086,347 | A | 2/1992 | Ukai et al. | |
| 5,113,134 | A | 5/1992 | Plus et al. | |
| 5,132,819 | A | 7/1992 | Noriyama et al. | |
| 5,175,504 | A | 12/1992 | Henley | |
| 5,233,448 | A | 8/1993 | Wu | |
| 5,235,272 | A | 8/1993 | Henley | |
| 5,260,818 | A | 11/1993 | Wu | |
| 5,268,678 | A | * 12/1993 | Nakazawa et al. | 345/93 |
| 5,298,891 | A | * 3/1994 | Plus et al. | 345/93 |
| 5,303,074 | A | 4/1994 | Salisbury | |
| 5,309,108 | A | 5/1994 | Maeda et al. | |
| 5,504,504 | A | * 4/1996 | Markandey et al. | 345/55 |
| 5,793,344 | A | * 8/1998 | Koyama | 345/87 |

FOREIGN PATENT DOCUMENTS

| JP | 58189615 | 11/1983 |
|---|---|---|
| JP | 02002947 | 1/1990 |
| JP | 02309324 | 12/1990 |

* cited by examiner

Primary Examiner—Dennis-Doon Chow
(74) Attorney, Agent, or Firm—Thomas A. Beck; Daniel P. Morris

(57) ABSTRACT

A matrix addressed display system designed so as to enable data line repair by electronic mechanisms which is efficient and low in cost and thus increases yield. Such active data line repair utilizes additional data driver outputs, a defect map memory in the TFT/LCD module and modification of the data stream to the data drivers by additional circuits between the display and the display adapter. A bus configuration on the display substrate is utilized which combines repair flexibility, low parasitic capacitance, and the ability to easily make the necessary interconnections. The number of interconnections is kept to a minimum, the connections are reliable, and the connections may be made with conventional wire bond or laser bond technology, or disk bond technology.

14 Claims, 12 Drawing Sheets

PRIOR ART

FIG.3

| PIXEL ADDRESS TO BE CORRECTED | SUBPIXEL CORRECTION ADDRESS | CORRECTION DESTINATION |
|---|---|---|
| 0 | 001 | 001 |
| 9 | 110 | 110 |
| 54 | 101 | 001 |
| 128 | 101 | 010 |
| 202 | 010 | 100 |
| 349 | 011 | 011 |
| 350 | 110 | 011 |
| 400 | 000 | 000 |
| 620 | 001 | 100 |
| 639 | 100 | 000 |

TFT LCD ACTIVE DATA LINE REPAIR

FIELD OF THE INVENTION

This invention relates to repair techniques for matrix addressed displays. More particularly, it relates to a matrix addressed display having apparatus for repairing and operating in the presence of line defects and to a method for effecting such repair. Of particular interest are active matrix liquid crystal displays, though the techniques taught herein apply to all matrix addressed displays having data drivers at both the top and bottom of the display.

BACKGROUND ART

A portion of a thin film transistor liquid crystal displays (TFTLCDs), also known as active-matrix liquid crystal displays (AMLCDs), are discarded from the manufacturing process because of data line defects. By repairing these defects the yield increases and the manufacturing cost decreases.

Defective data lines in TFTLCDs result from a number of mechanisms. Some occure due to metallurgical problems such as contamination during lithographic patterning of the data lines which manifest in opens or shorts. The shorts may occur between data lines themselves or between a data line and a gate line, or between a data line and some other part of the display circuit, such as the top plate. Other failures occur because some of the drivers on a data driver module fall below specification or fail, or because of a failure in the connection between the data lines on the glass and the driver chip.

Shorts can be removed by laser ablation, but some kinds of shorts (such as crossover shorts and top plate shorts) require that an open also be created by the laser ablation step. At present, the opens can then repaired as illustrated in FIG. 1.

In FIG. 1, the array portion 20 of an active matrix liquid crystal display is illustrated. A series of data lines 22 are each driven by one output of a data driver 24. For high resolution arrays which have a large number of lines per unit length, it is typical to have successive data lines 22 driven from the top and bottom of the array 20. Gate lines 26 are driven by gate line drivers (not shown). As is well known in the art, there is a thin film transistor located adjacent to each of the crossover points of every data line 22 and gate line 26 which drives a pixel or subpixel of the array 20. FIG. 1 includes a data line 22A which is driven from the top of array 20. Line 22A is open, that is, lacks electrical continuity due to a gap 28 so that transistors at intersections of data line 22A and gate lines 26 below gap 28 are not activated. This produces a so-called "line defect" which is highly visible and makes the panel totally unacceptable for sale as a commercial product unless an appropriate repair is effected. Conventionally a repair is made by mechanically connecting an insulated wire 30 between the top and bottom portion of the open data line. This method of repair is usually called a "yellow wire" repair, since this color of wire is often used to repair similar problems in printed circuit boards. The "yellow wire" jumper in FIG. 1 can physically run off the array substrate or be lithographically incorporated as a spare line on the array substrate. While correcting for opens, this type of repair introduces new problems. If the jumper wire is located on the glass, peripheral space on the substrate must be allocated, which increases the bezel area of the display package. Most importantly, jumper wires on the substrate must cross over or under other signal lines, and signal degradation will occur due to capacitive crosstalk with these other signal lines. If the jumper wire runs off the glass, signal degradation may occur due to other electromagnetic pickup. All of these problems also make it difficult to extend this repair method to repair more than one or two defective lines. Also, not all defects can be repaired in this manner. For example, defective data lines which are due to problems with the driver chip or driver chip connection usually require replacing the data drivers or discarding the entire defective panel.

SUMMARY OF THE INVENTION

It is a principal object of this invention to provide a matrix addressed display in which data line defects can be easily and inexpensively repaired.

It is another object of this invention to provide a method for easily and inexpensively repairing data line defects.

It is still another object of this invention to provide circuitry for manipulating pixel data so that an image is properly displayed when a data line repair is made.

It is yet another object of this invention to provide a method for manipulating pixel data so that an image is properly displayed when data line repair is made.

It is an additional object of the invention to provide a bus and repair pad design which is flexible, has a minimal crossover capacitance, and which is amenable to short-distance wire bonding.

In accordance with the invention several extra driver outputs are included in each data driver integrated circuit for repair as shown and described with respect to FIG. 2. These auxiliary drivers are connected to the defective lines via a metallurgical bonding technique. Open data lines are fixed by connecting auxiliary drivers, on the opposite side of the display, to the undriven ends of the open data lines. Weak/failed data drivers or low impedance loads can be corrected by adding a auxiliary driver in parallel with the existing driver, or opening the failed line and using one or more auxiliary drivers.

In the following discussion a pixel refers to a single picture element. In the case of a color display such as a TFT/LC display, the pixel is comprised of a trio of red, green and blue subpixels. In some cases four subpixels make up a picture element. In the case of a monochrome display, the smallest element in the display is the pixel, that is, there are no subpixels. It is also assumed in the discussion below that the data drivers in a color display accept three data elements at once, one each for red, green and blue. Though this is typical in the industry, other numbers of inputs can just as easily be accommodated in the techniques discussed.

BRIEF DESCRIPTION OF THE DRAWINGS

FIG. 3 is an example of a defect map for storing information concerning defective lines.

DETAILED DESCRIPTION OF THE PREFERRED EMBODIMENTS

Figure 1:
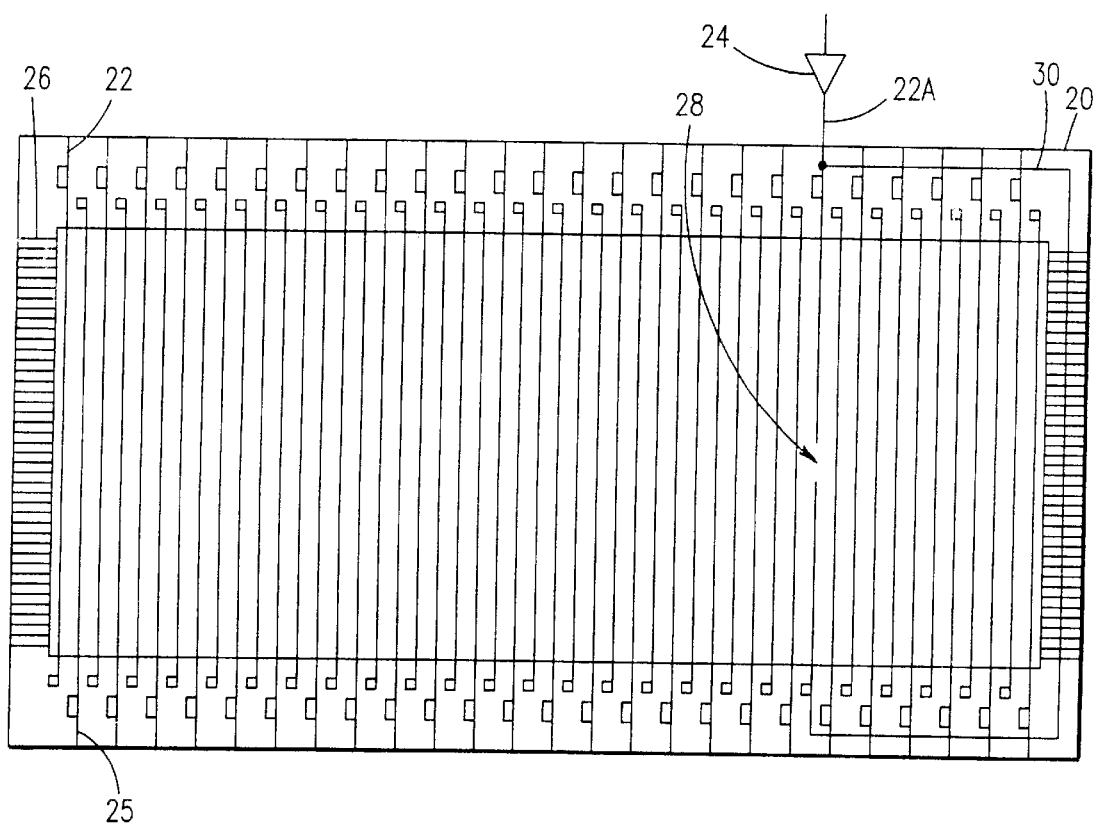
FIG. 1 is a schematic plan view of a liquid crystal display panel illustrating a conventional repair technique.
Figure 2:
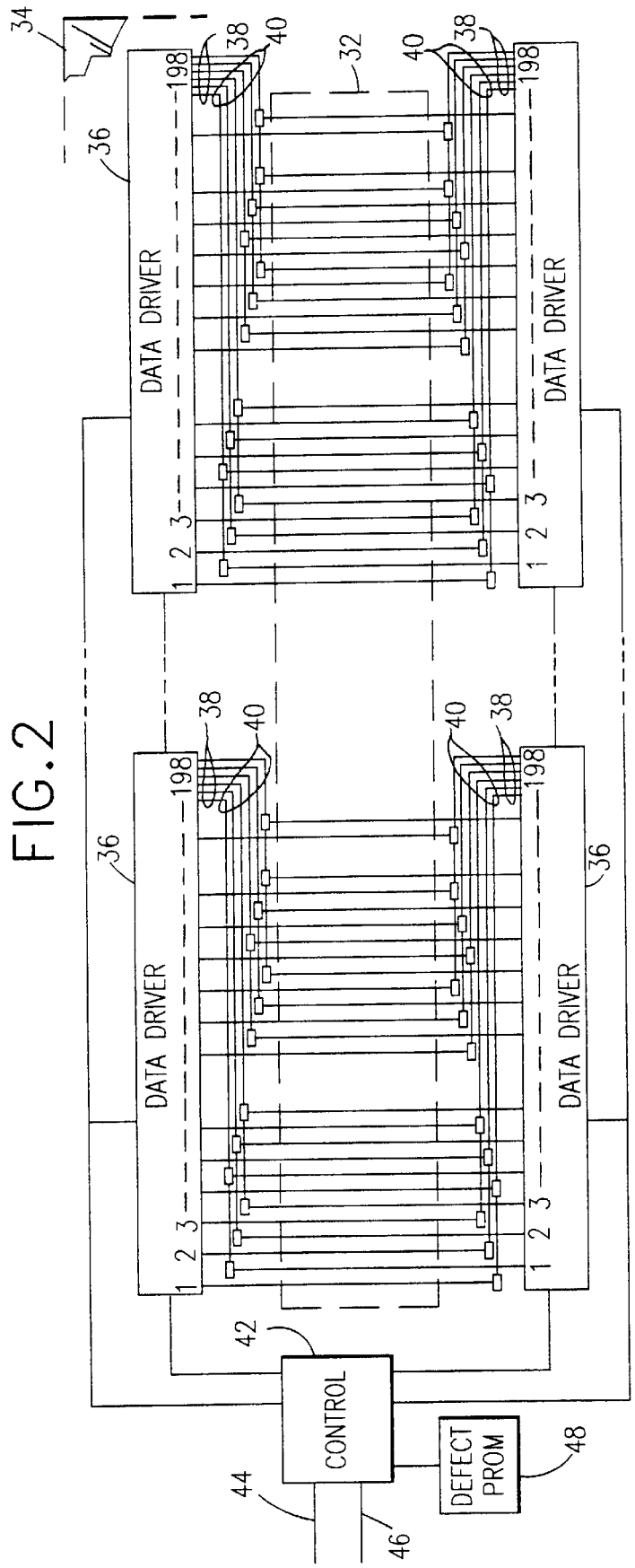
FIG. 2 is a block diagram of a liquid crystal display using the active line repair techniques in accordance with the invention.

Referring to FIG. 2, in an array 32 in accordance with the invention, the preferred manner of adding the auxiliary drivers to the glass panel 34 is to increase the number of output lines of each data driver 36. This results in the smallest increase in additional space and allows use of the highly integrated electronics in each driver. For example, use can be made of drivers having 201 outputs instead of 192. Several existing data drivers may be programmed for 192 or 201 outputs by simple selection. The extra nine lines (or less) can be used as auxiliary driver outputs. When the data lines of the display are connected to each data driver, the auxiliary data drivers are allocated to the end of the driver which is clocked in last as shown in FIG. 2. An allocation of S spare lines 38 per driver 36 will result in S*D total spare lines where D is the number of drivers.

Metal traces 40 must be patterned onto the glass of the display which enable a connection to bad data lines. These spare line traces 40 are placed perpendicular to display data lines as shown in FIG. 2. If laser welding is used to make a connection then the spare traces 40 should cross over data lines from the top and bottom data drivers. However, if wire bonding is utilized these traces only need to cross the data lines from the driver on one side. The opposite data lines terminate in line extension pads which are wire bonded to repair pads on spare traces. When a connection is made between a spare driver line and the defective line as previously described only one laser or wire bond is needed. This decreases the amount of time necessary to mechanically connect. Either process can be automated to minimize repair time.

The display controller 42, which receives display data, denoted as RGB Data on data bus 44, and appropriate control signals on control bus 46 must be provided with the necessary coordinate column number of the offending lines. To this end, a defect map PROM 48 is added to each TFT/LCD glass panel 34. PROM 48 may be a slow, small, serial device having a cost of one to two dollars, that loads the display controller's defect map on reset. The data stored in PROM 48 is determined by testing the panel.

Preferably, before it is fully assembled, the panel is tested in accordance with the method, and using the apparatus, disclosed in U.S. Pat. No. 5,179,345 to Jenkins and Wisnieff, but it will be understood that other methods and apparatus may also be used to generate the data.

The electrical connector used to connect the LCD panel to a data source such as a host computer needs only one extra line (not shown in FIG. 2) for the PROM chip select. Other PROM signals can be multiplexed on existing lines. After reset, controller 42 uses the addresses in the defect map to determine when to latch the incoming data into temporary memory for use on the spare lines 38. At the appropriate time the display's data drivers are loaded with the regular data plus the information for the defective lines as more fully explained below.

FIG. 3 shows how an example defect map PROM can be made. Each entry in the PROM has three fields which describe the pixel correction addresses: the horizontal count, the subpixels correction address and correction destination in which to store the data. The first field tells the controller which incoming pixel data to store. The second defect data field describes which subpixels of the pixel to keep and the last field tells where to store that data. The pixel address to be corrected only needs to contain enough bits to describe the data line location. Ten,bits of address, for example, would be needed to describe 640 pixels per line. The subpixel correction address needs three bits for red, green or blue; if one of the subpixels needs correction then the appropriate bit is cleared to zero. For the example with 6 spare lines per driver and 10 drivers then the table must contain 60 entries. This PROM would need 60 entries with 16 bits per entry. This results in a requirement for 960 bits to be stored, which easily fits into an eight pin serial PROM.

Figure 4:
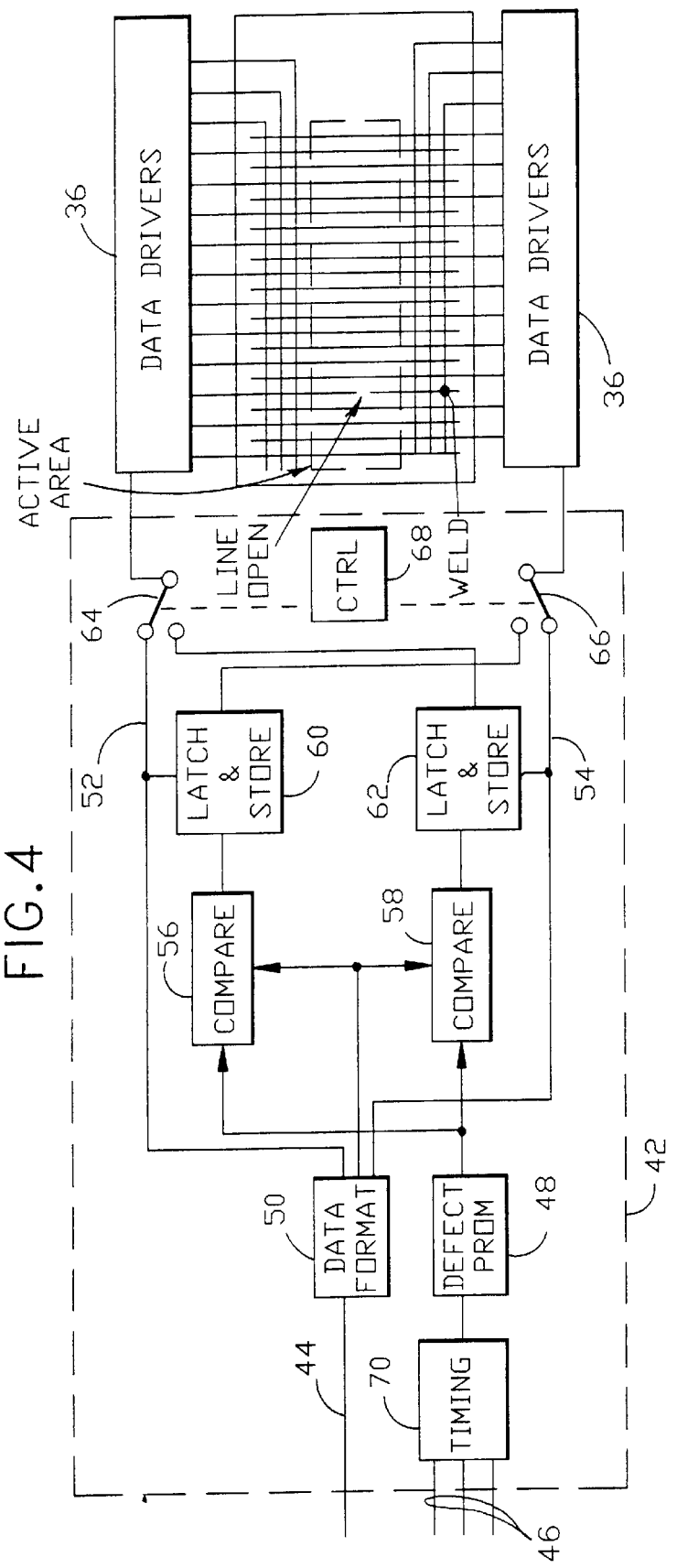
FIG. 4 is a general block diagram of a simplified liquid crystal display in accordance with the invention.

FIG. 4 illustrates in greater detail a possible structure for controller 42 of FIG. 2 and its connection to data drivers 36. The serial pixel data stream provided by bus 44 is received by a data format circuit 50 which divides the data into odd column data on bus 52 and even column data on bus 54. Data format circuit 50 also provides data address information for each set of data to a first compare circuit 56 and a second compare circuit 58. Circuits 56 and 58 compare the data address provided by data format circuit 50 to the addresses in defect PROM 48. When a match in the addresses occurs, a respective one of latch and store circuits 60 and 62 stores the current data for presentation to the data drivers 36 by way of a respective switch 64 or 66 operated by a control circuit 68. All of the operations described above with respect to FIG. 4 are controlled by a timing circuit 70 which receives control signals for horizontal and vertical synchronization as well as a pel clock by way of bus 46.

Figure 5:
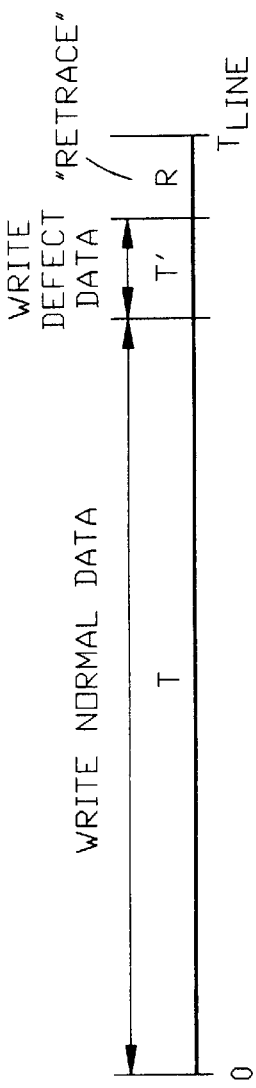
FIG. 5 is an illustration of the timing of normal and defect data supplied to the simple liquid crystal display represented in FIG. 4.

FIG. 5 illustrates the horizontal line time makeup utilized in the circuit of FIG. 4 for the simple case of one data driver chip on the top and one on the bottom. In a practical display there will be several drivers on the top and the same number on the bottom. This simplification is used for clarity of presentation. In a firsts time interval T, normal data for picture elements not associated with defective lines is written into the data drivers. In a subsequent time interval T', data required to write to picture elements associated with defective data lines is written into the data drivers. Finally, there is a retrace time between lines.

Figure 6:
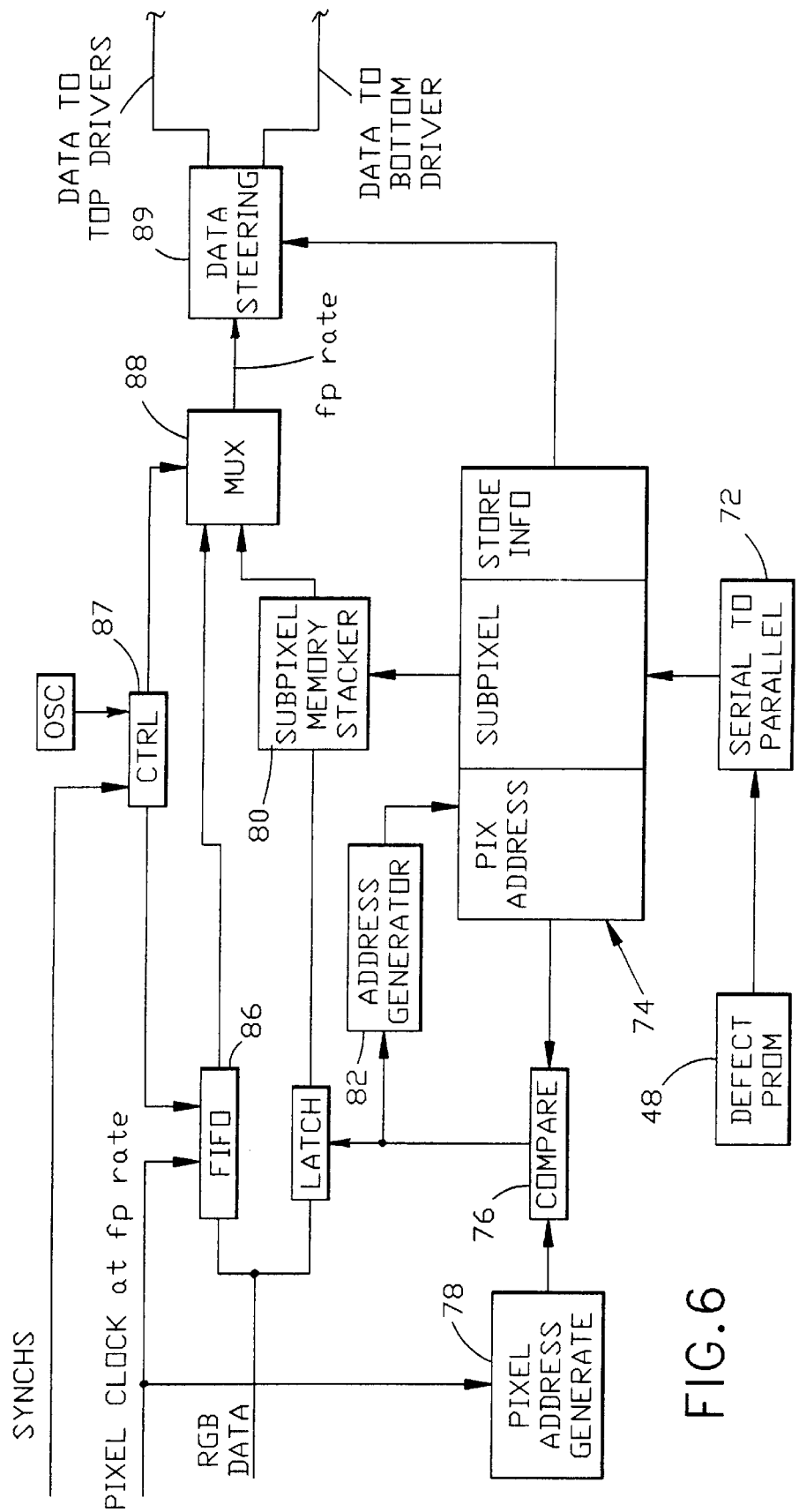
FIG. 6 is a first embodiment of a data control block which may be used to control data in a matrix addressed display in accordance with FIG. 4. This approach is referred to as the serial-processing approach.

FIG. 6 illustrates an implementation of the circuits which appropriately modify the data stream of the drivers. This implementation is a serial pixel processing approach and is especially useful when the pixel count is small, say VGA. The circuit count is small, but the pixel processing rate is the pixel clock rate from the source. The contents of the serial defect PROM on the TFT/LCD is converted into a parallel bit stream by a serial to parallel circuit 72 and copied into a fast defect map RAM 74. This loading occurs only upon reset. The RAM must allow addressing at the pixel clock rate. The data structure of the controller defect RAM 74 is the same as that of the serial defect PROM 48. Field one of the PROM or RAM defect data is used as one input to an address comparator 76. The other input to the comparator is the current pixel count from pixel counter 78. Fields two and three of the defect data generate an address for the dual subpixel memory stacker 80.

At the beginning of each horizontal line all counters are reset. Therefore, the defect map counter 82 points to its first entry. As valid data occurs, pixel counter 78 is incremented. If the pixel count equals the pixel column number stored in the defect RAM a signal is given to latch that pixel data and to increment the defect map counter 82 to point to a new address. The subpixel field provides the necessary information to the dual memory stacker 80 to determine which subpixels are to be corrected and where they should be stored in the stacker. After each set of top and bottom drivers is loaded, the subpixel memory stacker 80 is put in read mode and loads the data into the auxiliary data drivers via the multiplexer 88 and the data steering circuitry 89. At the same time the repair data is being loaded into the drivers, a FIFO (First In First Out Circuit) 86, clocked by a control circuit 87, buffers the non interrupted data stream. This is required because the incoming data stream cannot be stopped while the repair data is being loaded into the data driver chip. The size of the FIFO 86 only needs to be a little larger in depth than the total number of pixels capable of being repaired. After the repair data drivers have been loaded, the memory stacker 80 is reset, put back into write mode and normal data is sent from the FIFO 86 to the display by way of selector 88. This process continuously repeats until all data drivers are loaded. Subsequently, the circuits are reset and operations begin again.

Figure 7:
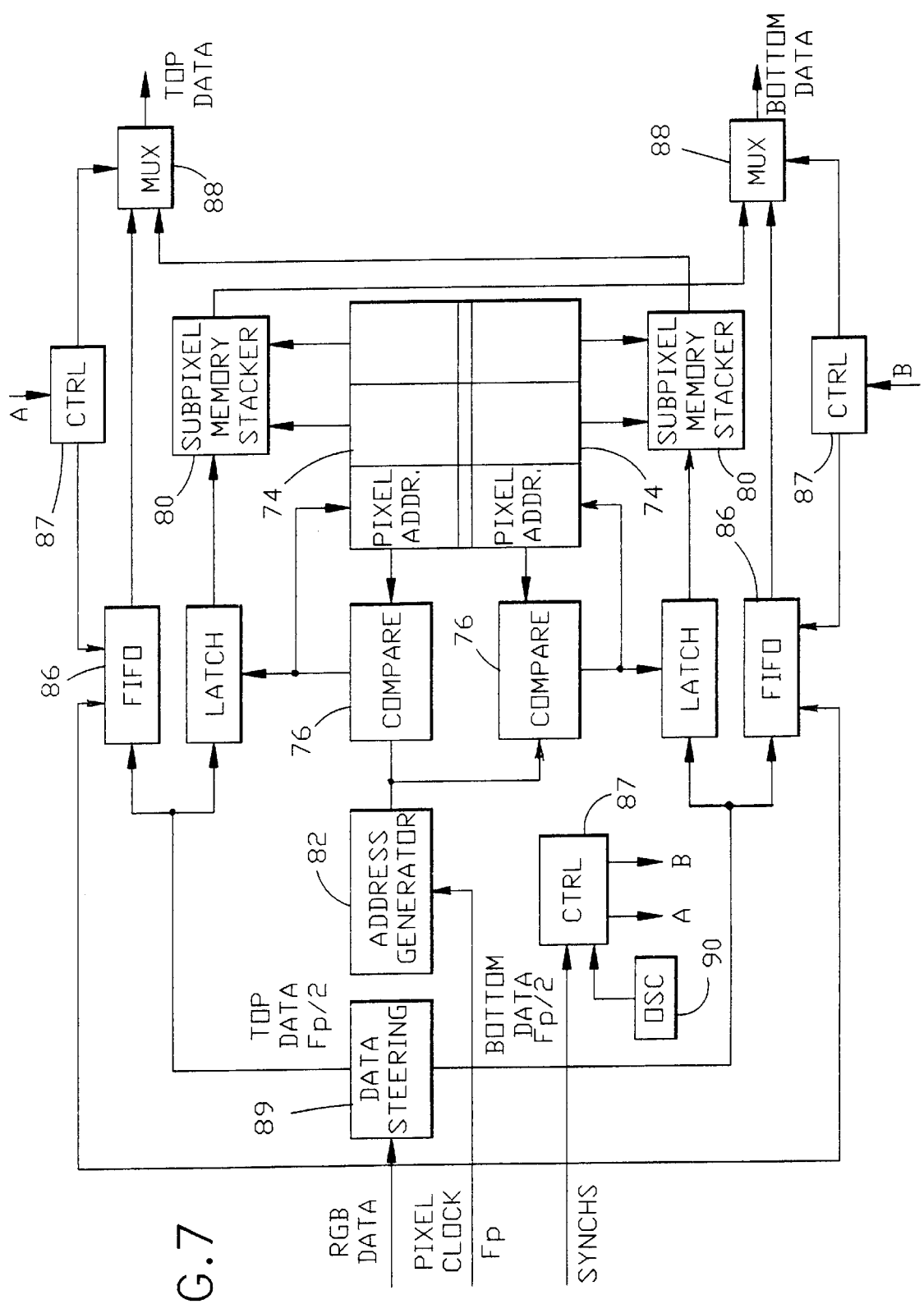
FIG. 7 is a second embodiment of a data control block which may be used to control data in a matrix addressed display in accordance with FIG. 4. This approach is referred to as the source-synchronous-parallel-processing approach.

FIG. 7 shows an alternative implementation which is called source-synchronous-parallel-pixel processing. Blocks with like numbers function as described above for FIG. 6. Defect data is stored as described above. The incoming pixel data stream is initially broken into two data streams by the data steering circuitry 89. One stream is for drivers on the top of the display and the other for drivers on the bottom of the display. Data in the top and bottom branches run at half the Source pixel rate and this is an advantage for large pixel count displays which have high clock rates. Additional circuitry is needed to process data in parallel. The basic function of comparing the incoming pixel address to the address of a defective line and latching that data if a match is found is similar to that described above. In this case, however, each of the two data paths have FIFOs and latches. Also shown duplicated are the compare and defect RAM circuits. This is shown for continuity of concept from FIG. 6. A single compare and defect RAM, however, can be used as long as the address generation and the defect RAM are changed accordingly. In this case, we would compare not a pixel column address, but a pixel-pair column address and the RAM would have to control two subpixel memory stackers. Note also that the repair data from the top data path is now multiplexed into the bottom data path and vice versa. This approach is called source synchronous because the writing into the latches and FIFOs are synchronous with the data source at half the pixel clock rate. The output to the display can be asynchronous and at a frequency set by oscillator 90. In fact, the repair data can even be sent out at a different clock rate than the normal data if the system design requires it.

Figure 8:
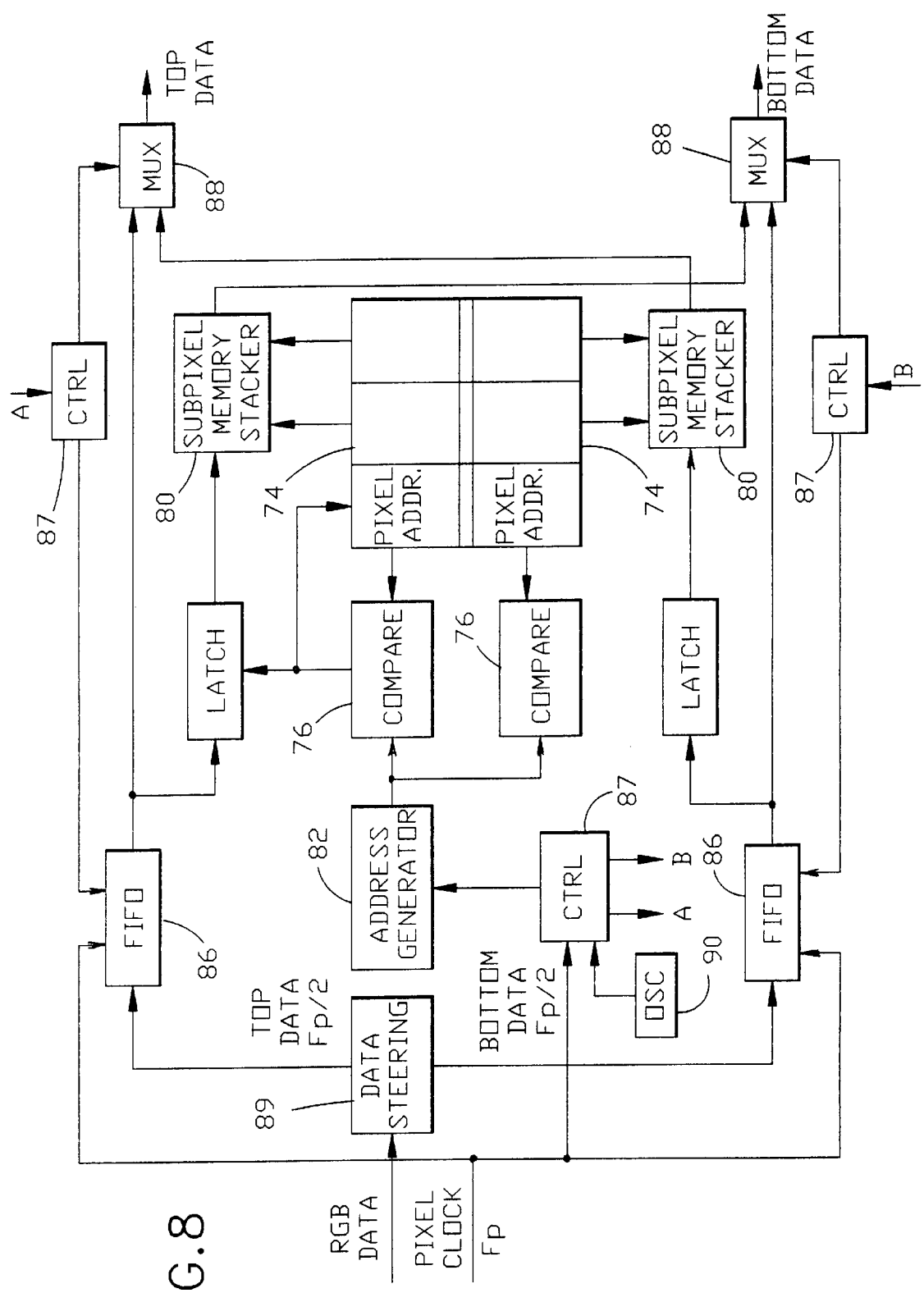
FIG. 8 is a third embodiment of a data control block which may be used to control data in a matrix addressed display in accordance with FIG. 4. This approach is referred to as the display-synchronous-parallel-processing approach.

The circuit of FIG. 8 is yet another embodiment of the control block 42 of FIG. 2. This case is called display-synchronous-parallel-pixel processing. The key difference in this implementation is the placement of the pixel processing circuitry after the FIFO circuit 86 in the data stream. This enables the pixel processing circuits to operate independently of the source pixel rate. More specifically, the implementation shown in FIG. 8 places the Dual subpixel Memory Stacker (DSMS) between the FIFO and the display. The previous implementation placed it across the FIFO. In the prior implementation the DSMS accepted data from the pixel data source and would later supply that data as ALR repair data to the output data stream. The FIFO buffers the incoming data from the pixel source while the ALR data is being placed into the output data stream. Because the data rate from the pixel source can be quite different than the data rate to the display, the DSMS in the prior scheme might need to accept and supply data at two possibly quite different rates. This can complicate a design. In addition, systems that are designed to provide multiple parallel data paths in to the display can create a problem for buffering the repair data in the prior scheme.

In the implementation shown in FIG. 8, the FIFO is used in exactly the same way as in the prior scheme. However, the DSMS now accepts data from the output of the FIFO and not from the original pixel data source. Therefore, the data rate into and out of the DSMS is identical. This simplifies the design of the DSMS. In addition, the higher resolution displays that will be on the market soon are likely to use parallel data paths into the display. Therefore, the data rate into the display is likely to be substantially lower than the data rate from the source. This can greatly simplify the design while lowering the cost and power requirements. Additionally, because the embodiment of FIG. 8 does not store any data in the DSMS until it is actually being sent to the display, the data buffering scheme is much simpler.

Figure 9:
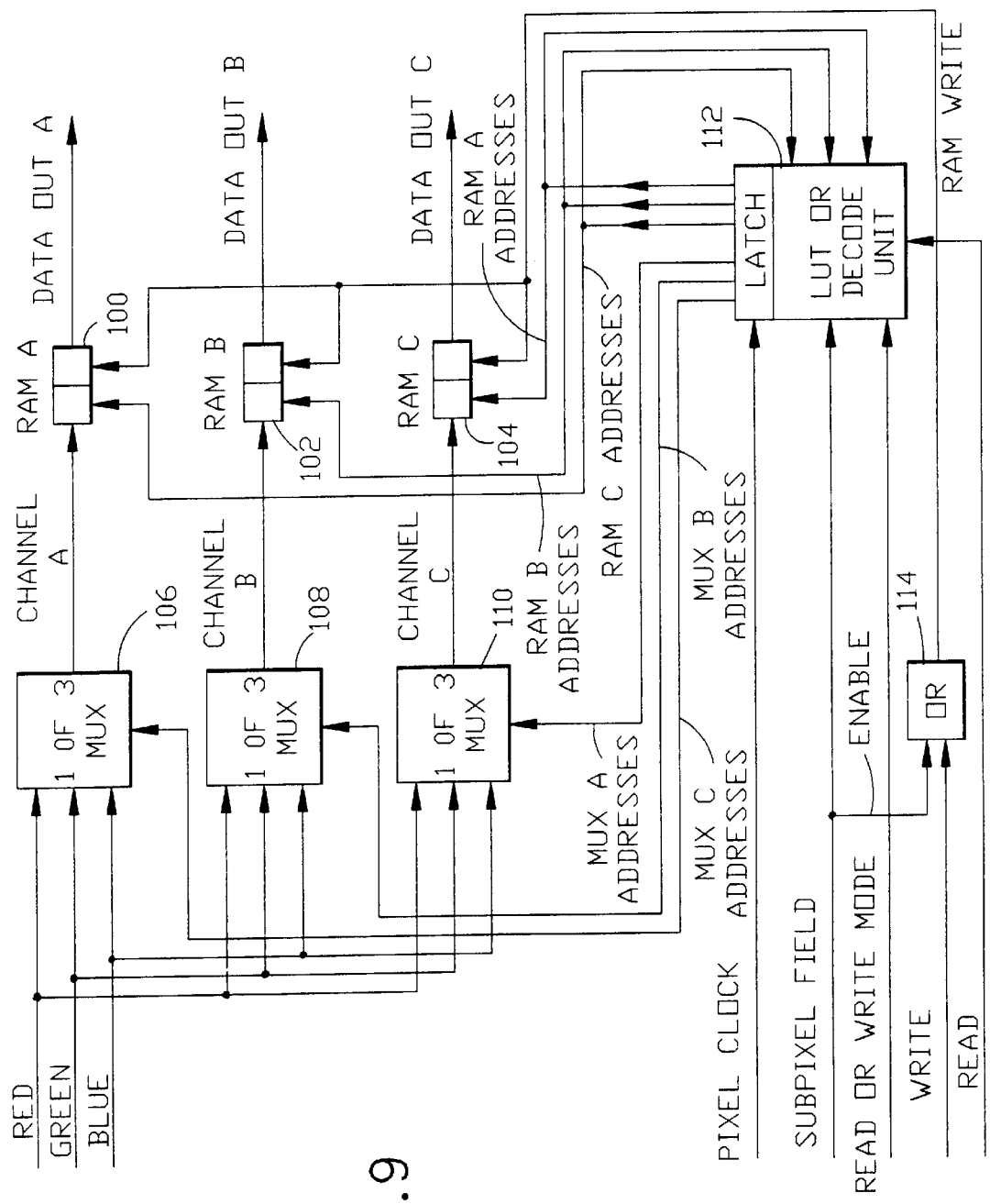
FIG. 9 is a block diagram of a new subpixel memory stacker useful in the embodiments illustrated in FIG. 7, FIG. 8 and FIG. 9.

The dual subpixel memory stacker described in the previous implementations contains circuitry which appropriately sorts and stores subpixel data for tile auxiliary drivers. FIG. 9 shows the circuitry comprising a dual pixel memory stacker for the case of 6 repairs per driver chip. During the write mode the repair data subpixel fields are used to determine if one or more subpixels must be stored into the A, B or/and C RAMs 100, 102 and 104, respectively. These RAMs may be DRAMS, SRAMS or simple transparent D latches with addressing circuits. The stackers track which address is available to store new information. To illustrate, let the first cell of RAM A be filled with prior data. That cell contains data for the first spare of that driver. Now a new subpixel field address comes into the unit because the defect map counter 82 points to the next entry. This subpixel field is, for example 100100, which means the green and blue subpixel data must be saved and the data are to be placed in the next two available storage locations. This causes the triple 1-of-3 multiplexers 106, 108 and 110, respectively, to route the green channel to cell one of RAM B and the blue channel to cell one of RAM C. Next this data is written into the RAM banks. The LUT or decode unit 112 generates the next set of addresses based upon the next subpixel fields and the address of the prior open cell. In this example it would point to cell 2 of RAM A as the next available storage location. After each set of top and bottom drivers are loaded, the LUT or decode unit 112 is reset and the process begins for the next set of drivers.

The LUT or decode unit 112 may be eliminated by precomputing the multiplexer and RAM addresses for each panel. Instead of a subpixel correction and destination address, the serial PROM and defect map RAM would contain the multiplexer and RAM addresses. Additional bits would be used to signal a write operation to the top or bottom data drivers.

Figure 10:
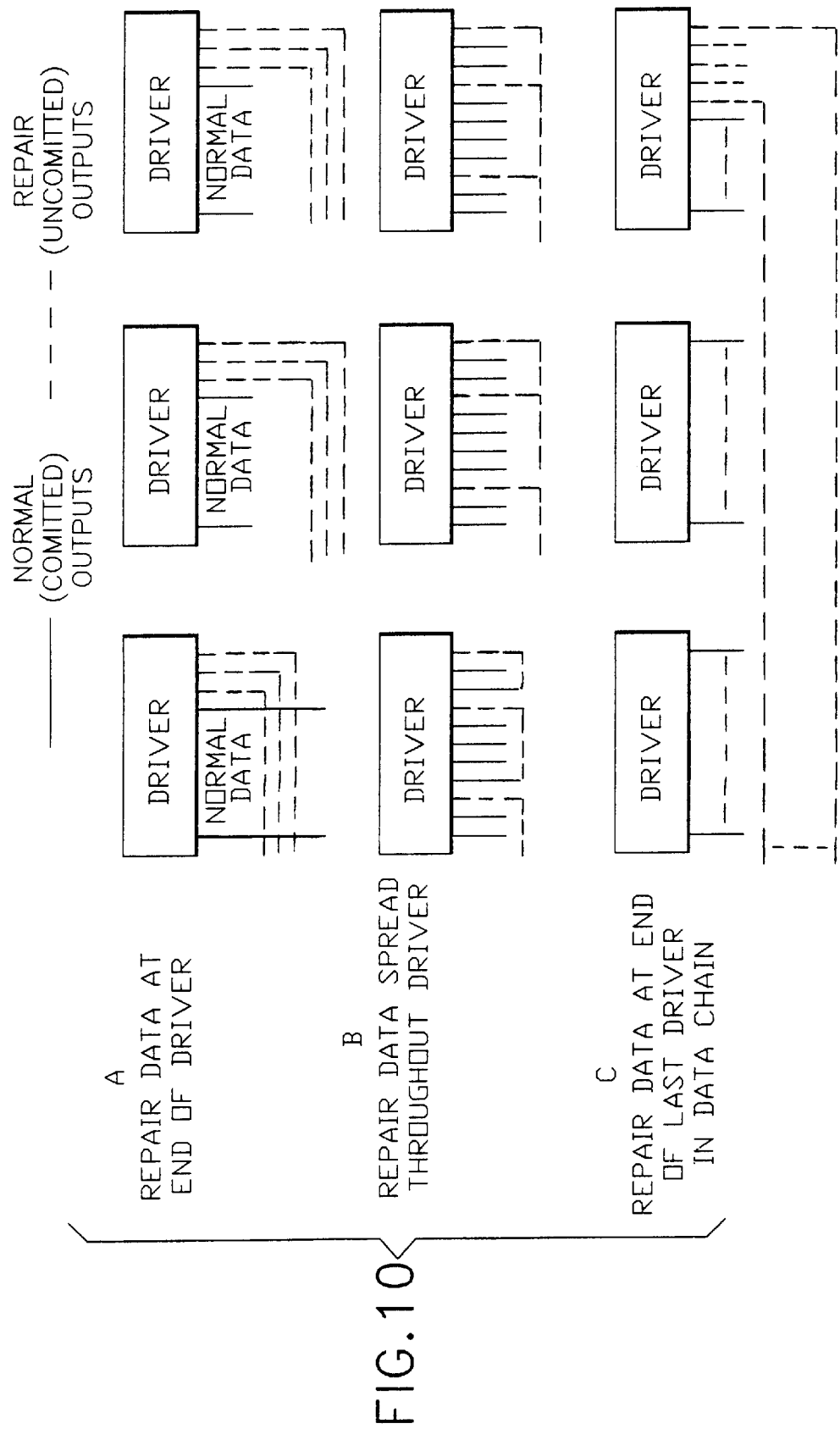
FIG. 10 is a diagram showing three possible ways to distribute the repair lines among the data driver outputs in a matrix addressed display.

Various modifications to the invention will be suggested. FIG. 10 shows three ways in which the repair lines can be distributed amongst the data drivers. FIG. 10A shows the case previously described in which the last several outputs of each data driver are reserved or are uncommitted for use as repair drivers. Note that the wiring from these repair outputs crosses over all the outputs of this one driver. Line lengths and capacitance are small. FIG. 10B has the repair lines distributed, perhaps evenly, amongst the driver outputs. Line lengths are even shorter and fewer crossovers and capacitance result. The timing and control is different than case A, but it may be the preferred way given other system constraints. FIG. 10C has all of the repair lines attached to the last driver outputs of the last driver in the string. Repair line lengths, crossovers and capacitance are larger than case A, but in some respects the timing and control may be simpler depending, again, on system constraints. In all these cases, there is a similar set of drivers at the other end of the data lines.

Figure 11:
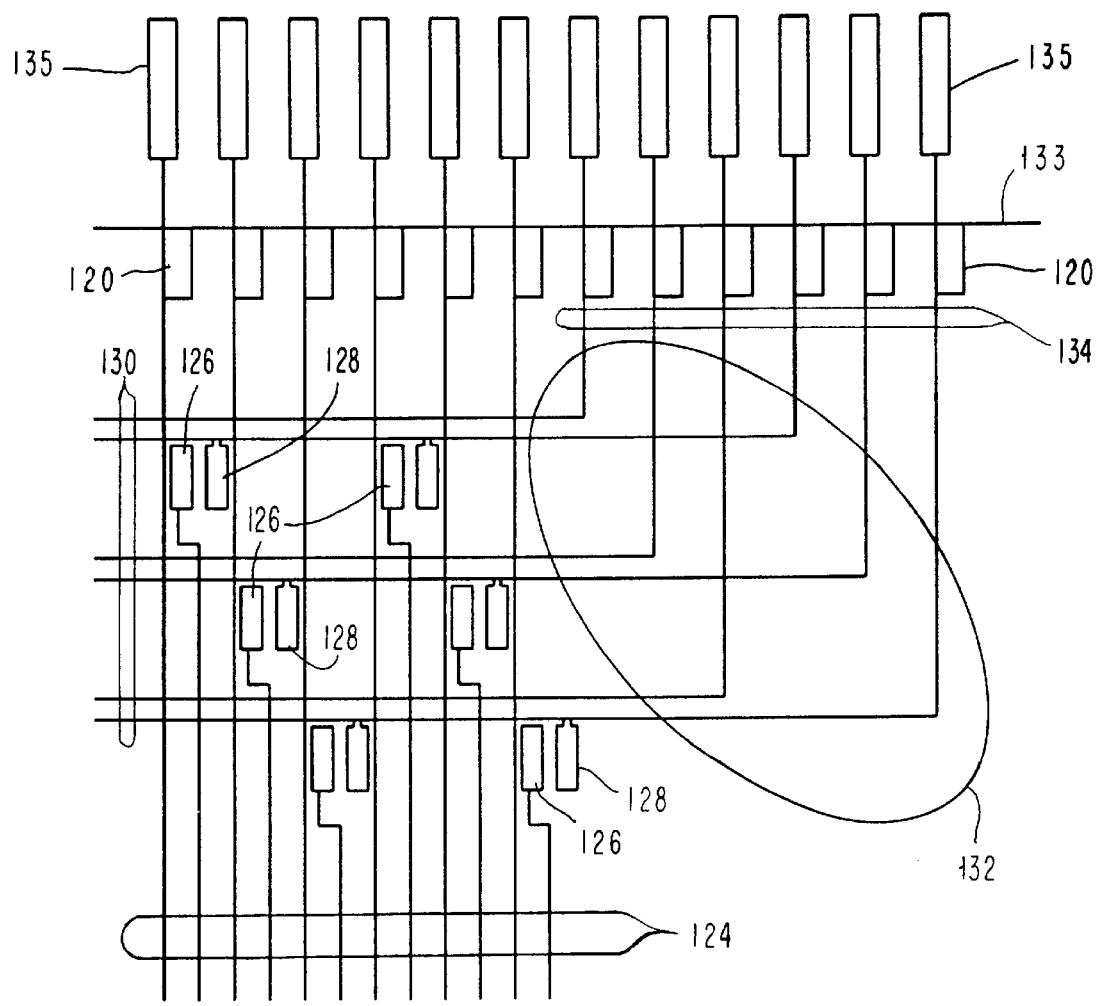
FIG. 11 is a detailed plan view of a bus structuring providing simple repair paths for defective lines.

Referring to FIG. 11, a portion of the bus structure at the top edge of the panel is illustrated, with the TFT array not being shown in the figure. The array is located off and below the portion shown. At the top of the figure, electrostatic discharge protection devices 120 are shown. Above these devices is a shorting ring 133 of a type generally known in the art, and above this, pads 135 for tape automated bonding (TAB) connections to the top data driver chips. As discussed previously, alternate lines 124 are driven from the top or bottom. Lines driven from the bottom are connected to line extension pads 126 which are disposed adjacent to repair pads 128. The repair pads are connected to a horizontal line 130 of a bus shown generally as 132. The bus lines are connected to six uncommitted driver outputs from data drivers 36 (FIG. 2) and as shown in FIG. 10C, by way of vertical lines 134.

Figure 12:
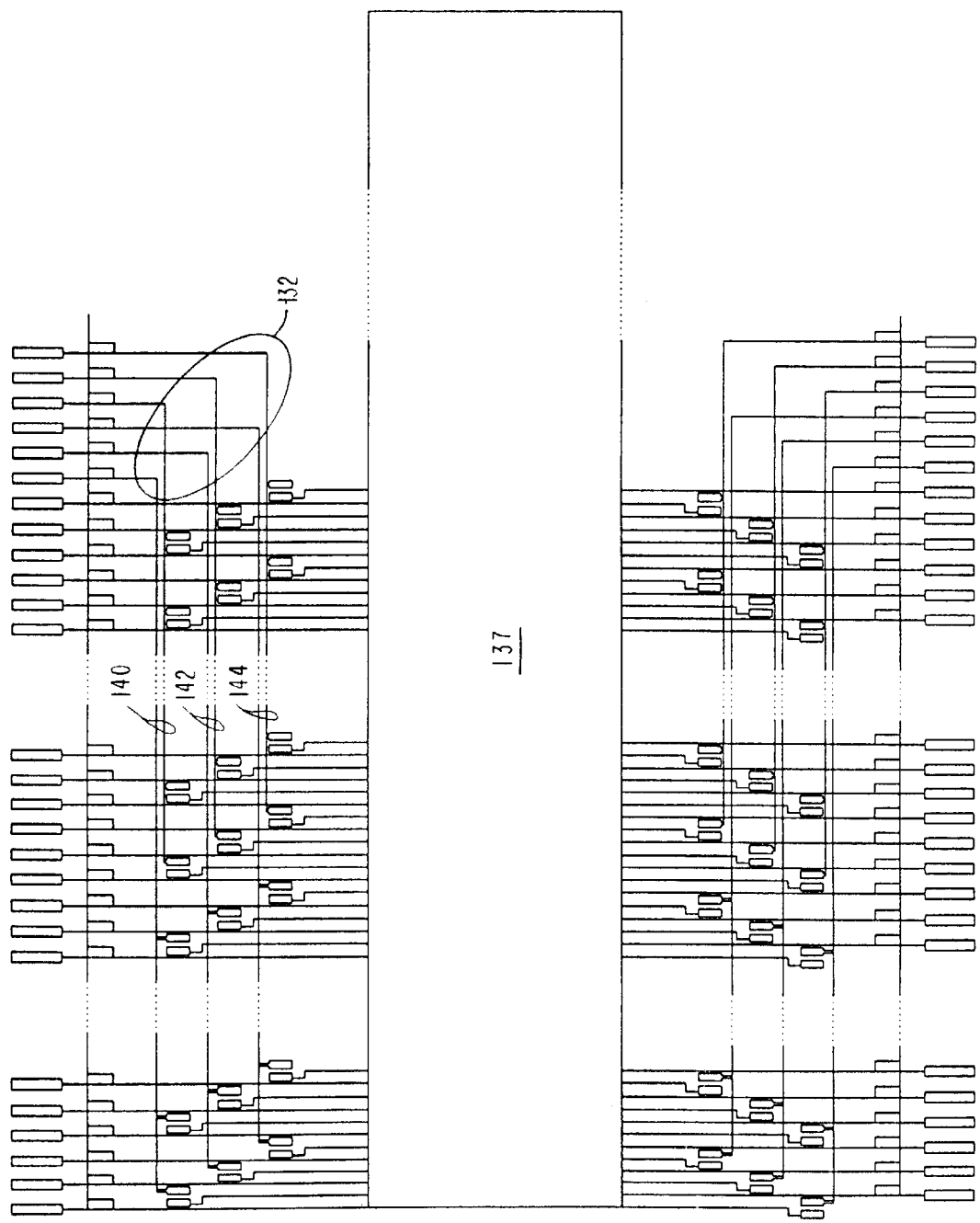
FIG. 12 are exploded views of the bus structure of FIG. 11.

Referring to FIG. 12, an example of the entire repair bus network is shown for a driver group pair. Both top and bottom repair bus networks are shown, with the TFT array 137 in the center. The six uncommitted output lines of bus 132 are grouped as three groups 140, 142, and 144 of two lines each. In each group, one uncommitted output line is connected to repair pads on one half of the driver group. One line extends the entire length of the driver group, and the other extends over half the length of the driver group. With this bus configuration, only one defective line of a given color can be repaired within each half of a data driver group. If two or more lines with the same color are defective within half of a driver group, only one can be repaired. It should also be noted that with this bus configuration, the maximum number of crossovers of a repaired line with other data lines is the number of driver outputs of a single driver. By limiting the number of crossovers in this way, the integrity of the active line repair data signals is maintained, because the parasitic capacitance of the line is held to an acceptable level.

Figure 13:
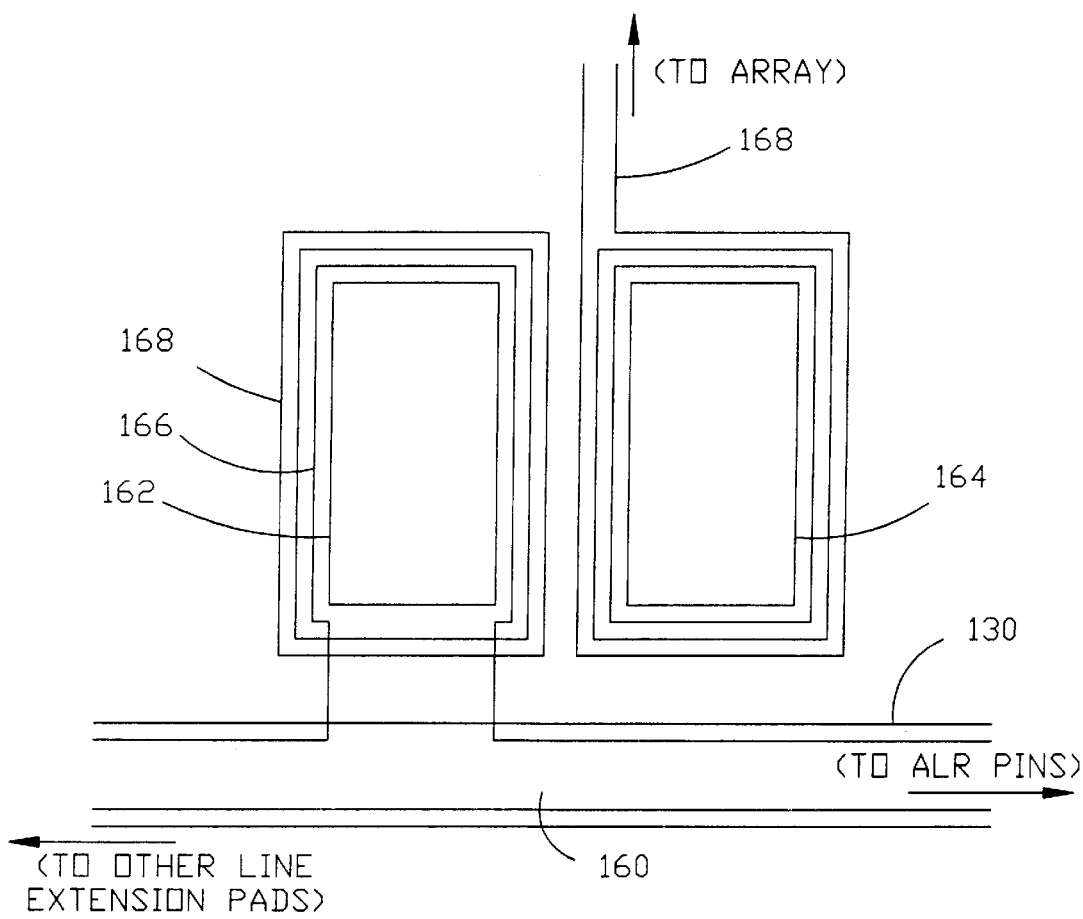
FIG. 13 is an enlarged plan view of the layout of various metal conductors used in the bus structure of FIG. 11.

Referring to FIG. 13, the detail of a line extension pad and repair pad pair are shown. The repair bus lines 130 must cross under other data lines 124 and (as shown in FIG. 11) and are fabricated with gate metal. In this embodiment, the gate metal bus lines 130 also have a redundant spine 160 of ITO which is also used to connect to the repair pad region through ITO layer 166. Vias 162 and 164 are made in the passivation layer insulator, to provide an opening to both the repair pad 128 and line extension pad 126. A layer of ITO 166 is present on both pads. In this way, the layer structure of both pads is identical, which consists of ITO 166, data metal 168, vias 162 and 164. This pad symmetry may facilitate reliable bonding between the two pads. To effect a repair of a defective line, the line extension pad and repair pad must be connected together. This may be done using a variety of wire bonding or laser welding techniques. Examples include ball bonding, wedge bonding, and other techniques well known to those skilled in the art. One of the advantages of the present invention is that only one bond is required to implement a repair, and the connection points are the repair and line extension pads, which are adjacent to each other.

The preferred method of making connection is disk bonding. This technique uses a combination of ultrasonic energy and compression to bond a disk of metal between the line extension pad and the ALR repair pad, using a bond tip. The disks are made by punching out a small dot, about 100 microns in diameter, from a thin foil of aluminum, about 40 microns in thickness. Other soft metals may also be suitable. The disks are distributed on a flat surface, and picked up individually by the bond tip. The bond tip is a precision machined tapered cone with a a tip area slightly larger than the dot diameter, and also of a size to cover both the repair pad and line extension pad pair. The bond tip has a groove running from one side of the tip to the other. This groove allows efficient transfer of ultrasonic energy from the bond tip to the disk and substrate surface. During the bonding process, the disk metal extrudes outward forming a button shape, with a ridge of metal left from the impression of the groove in the bond tip. This bond is mechanically robust, and forms an electrical connection between pads with a resistance less than 1% that of a typical data line in the array.

What is claimed is:

1. In a matrix addressed display having gate lines, datalines and thin film transistors controlled by said gate lines and said data lines, and drivers for driving said gate lines and said data lines, an apparatus for repair of line defects, comprising:
    data line drivers for driving said data lines, said data drivers having multiple outputs including uncommitted outputs;
    conductive auxiliary lines on said matrix addressed display, each connected to one of said uncommitted outputs of said data line drivers;
    connections for connecting defective lines to said auxiliary conductive lines; and
    a data circuit to dynamically modify data supplied to said matrix addressed display so as to include defective line information stored in a defect map specific to each matrix addressed display and to selectively activate uncommitted data driver outputs to provide data signals on said conductive auxiliary lines, said apparatus for repair of line defects capable of being turned on or off.

2. The display of claim 1 wherein said connections are laser bonds.

3. The display of claim 1 wherein said connections are wire bonds.

4. The display of claim 1 wherein the defect map memory is a PROM.

5. The display of claim 1 wherein the display is an active matrix display.

6. The display of claim 1 wherein the display is a simple or passive matrix display.

7. The display in claim 1 wherein the display technology is a thin film transistor/liquid crystal display.

8. The display in claim 1 wherein the display is an electroluminescent display or a plasma display or a field emission display, or electrophoretic display or electrochromic display, or a deformable mirror display or other matrix addressed display technology.

9. The display in claim 1 wherein the data drivers are integrated in the display.

10. The display in claim 1 wherein the data drivers are external to the display.

11. The display of claim 1, wherein said connections are disk bonds.

12. The display of claim 1 wherein said disc bond is formed with ultrasonic energy and compression using a bond tip.

13. In a liquid crystal display having gate lines, data lines, thin film transistors controlled by said gate lines and said data lines, and drivers for driving said gate lines and said data lines, a method for driving the display after repair of line defects, comprising:

providing data line drivers for driving said data lines, said data drivers having uncommitted outputs;

providing conductive auxiliary lines each connected to one of said uncommitted outputs of said data line drivers;

providing connections for connecting defective lines to said auxiliary conductive lines;

providing a defect map memory for storing information concerning location of line defects of the display; and modifying data supplied to the display so as to included defective line information stored in said memory and to selectively activate selected uncommitted data drivers to provide data signals on said conductive lines.

14. An active data line repair technique which includes: auxiliary or uncommitted data drivers, a defect map PROM in the display module, metal lines on the display capable of being connected to bad data lines, and a data stream modified to include defective line information which is ordered and sent to specific auxiliary drivers.

* * * * *